(12) United States Patent
Ohsawa

(10) Patent No.: US 11,476,210 B2
(45) Date of Patent: Oct. 18, 2022

(54) SEMICONDUCTOR DEVICE AND SEMICONDUCTOR PACKAGE

(71) Applicants: Kabushiki Kaisha Toshiba, Tokyo (JP); Toshiba Electronic Devices & Storage Corporation, Tokyo (JP)

(72) Inventor: Keiichiro Ohsawa, Saitama Saitama (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/011,041

(22) Filed: Sep. 3, 2020

(65) Prior Publication Data

US 2021/0288006 A1    Sep. 16, 2021

(30) Foreign Application Priority Data

Mar. 16, 2020 (JP) .............................. JP2020-045537

(51) Int. Cl.
*H01L 25/18* (2006.01)
*H01L 21/66* (2006.01)
(Continued)

(52) U.S. Cl.
CPC .............. *H01L 24/05* (2013.01); *H01L 22/32* (2013.01); *H01L 24/02* (2013.01); *H01L 24/03* (2013.01); *H01L 24/13* (2013.01); *H01L 24/45* (2013.01); *H01L 25/0657* (2013.01); *H01L 25/18* (2013.01); *H01L 2224/024* (2013.01); *H01L 2224/0219* (2013.01); *H01L 2224/0237* (2013.01); *H01L 2224/0239* (2013.01); *H01L 2224/02185* (2013.01); *H01L 2224/02311* (2013.01); *H01L 2224/02331* (2013.01); *H01L 2224/03011* (2013.01); *H01L 2224/0401* (2013.01); *H01L 2224/04042* (2013.01); *H01L 2224/05008* (2013.01); *H01L 2224/05017* (2013.01); *H01L 2224/05124* (2013.01);
(Continued)

(58) Field of Classification Search
CPC ....................................................... H01L 24/05
See application file for complete search history.

(56) References Cited

U.S. PATENT DOCUMENTS 9,972,555 B2    5/2018   Kuroda et al.
2004/0007778 A1  1/2004   Shinozaki et al.
(Continued)

FOREIGN PATENT DOCUMENTS

JP    2006-210438 A    8/2006
JP    2007-335888 A    12/2007
(Continued)

*Primary Examiner* — William A Harriston
(74) *Attorney, Agent, or Firm* — Allen & Overy LLP

(57) ABSTRACT

A semiconductor device includes: a first semiconductor chip having a first pad and a second pad, a depression being formed in the second pad; an organic insulating film provided on the first semiconductor chip, the organic insulating film covering the depression and not covering at least a portion of the first pad; and a redistribution layer having a lower portion connected to the first pad and an upper portion disposed on the organic insulating film.

7 Claims, 9 Drawing Sheets

(51) Int. Cl.
*H01L 25/065* (2006.01)
*H01L 23/00* (2006.01)

(52) U.S. Cl.
CPC ............. *H01L 2224/13024* (2013.01); *H01L 2224/4502* (2013.01); *H01L 2225/0651* (2013.01); *H01L 2225/06513* (2013.01); *H01L 2225/06586* (2013.01); *H01L 2225/06596* (2013.01); *H01L 2924/01022* (2013.01); *H01L 2924/01028* (2013.01); *H01L 2924/01029* (2013.01); *H01L 2924/07025* (2013.01); *H01L 2924/1431* (2013.01); *H01L 2924/1436* (2013.01)

(56) References Cited

U.S. PATENT DOCUMENTS

| | | | |
|---|---|---|---|
| 2006/0164110 A1 | 7/2006 | Miyazaki et al. | |
| 2009/0243118 A1* | 10/2009 | Akiba | H01L 24/06 257/773 |
| 2015/0115269 A1 | 4/2015 | Ishii et al. | |
| 2018/0374795 A1 | 12/2018 | Deguchi et al. | |
| 2020/0335408 A1* | 10/2020 | Gao | H01L 24/05 |

FOREIGN PATENT DOCUMENTS

| | | |
|---|---|---|
| JP | 2015-88576 A | 5/2015 |
| JP | 2018-19006 A | 2/2018 |
| JP | 6538960 B2 | 7/2019 |

\* cited by examiner

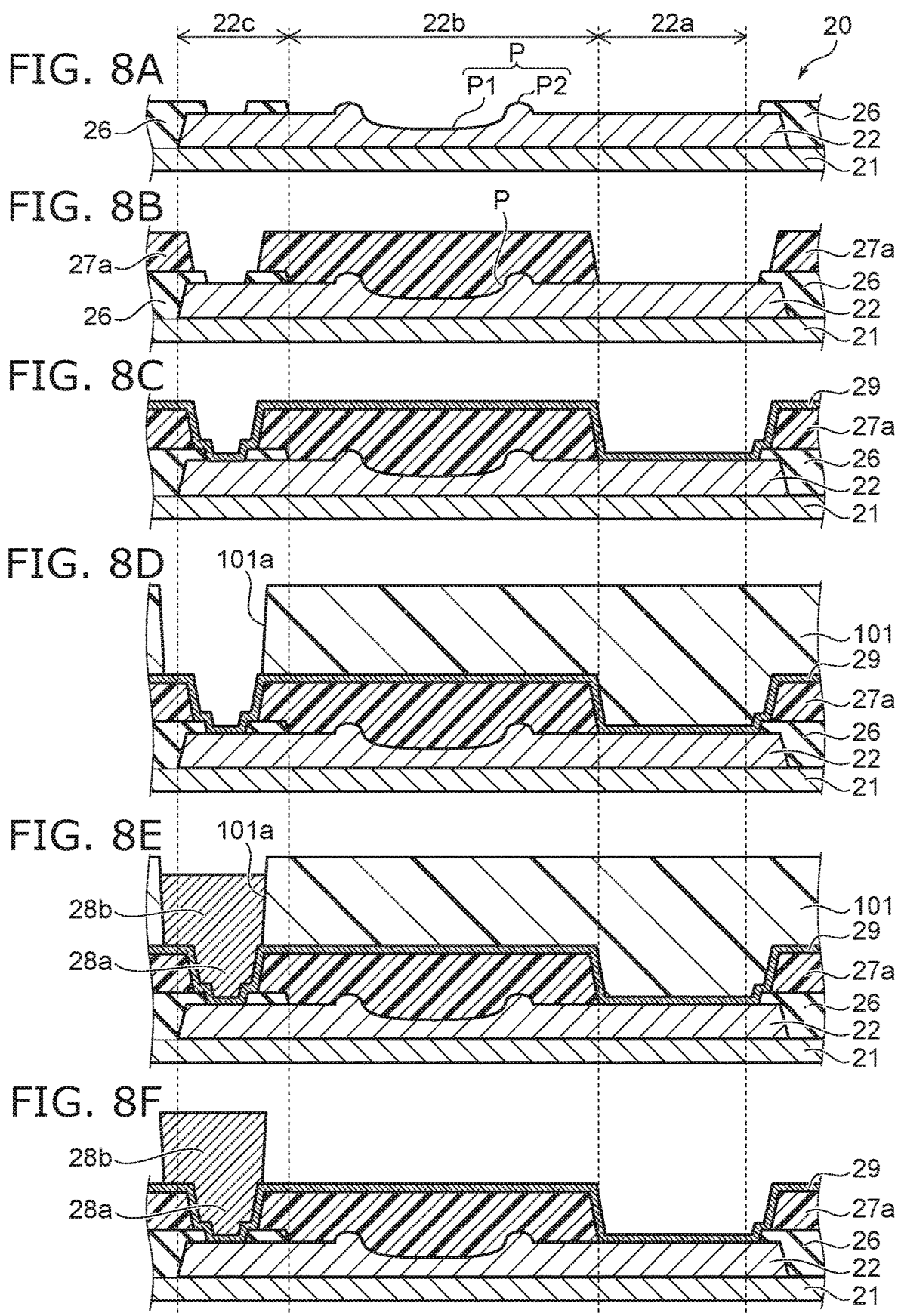

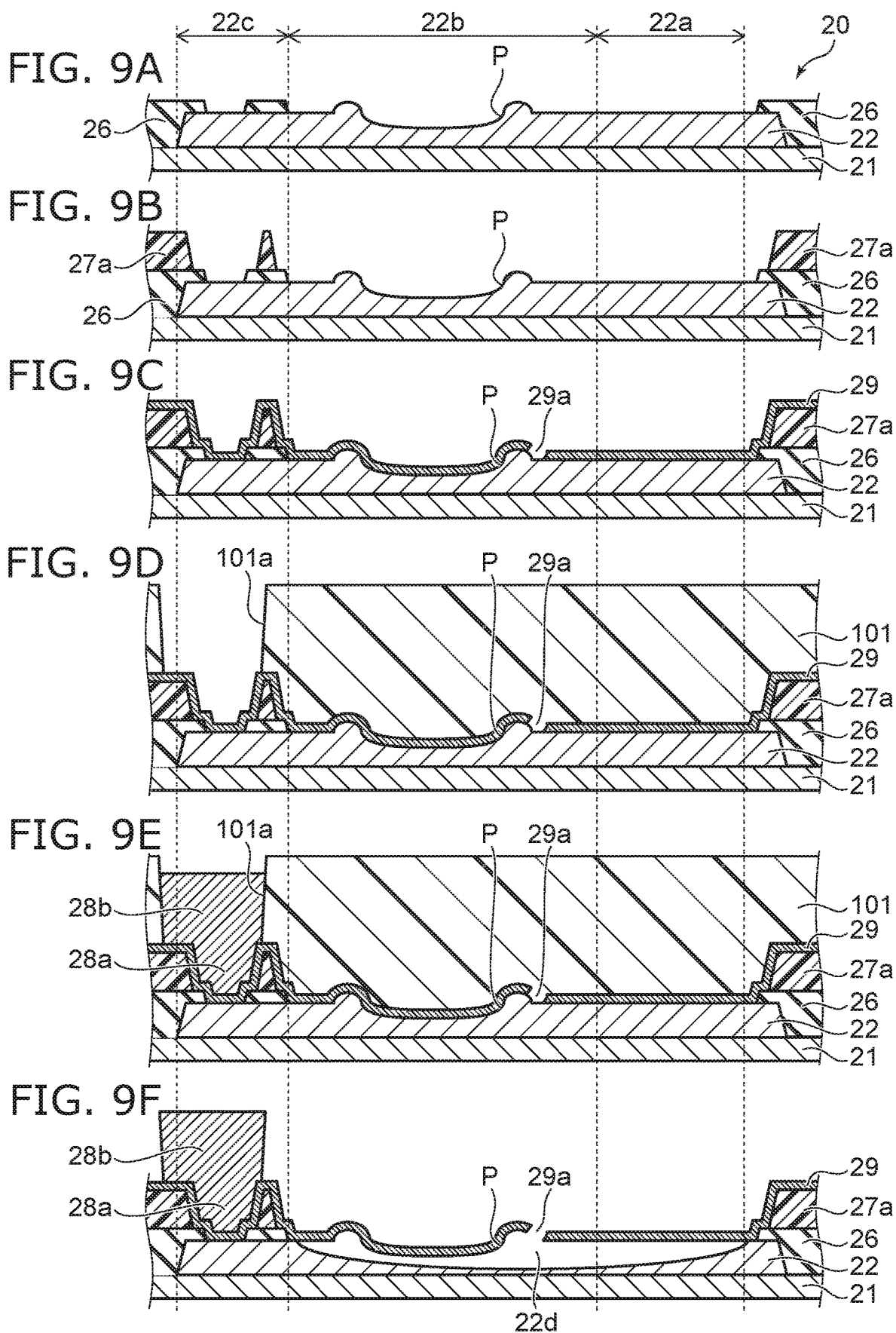

US 11,476,210 B2

SEMICONDUCTOR DEVICE AND SEMICONDUCTOR PACKAGE

CROSS-REFERENCE TO RELATED APPLICATIONS

This application is based upon and claims the benefit of priority from Japanese Patent Application No. 2020-045537, filed on Mar. 16, 2020; the entire contents of which are incorporated herein by reference.

FIELD

An embodiment relates to a semiconductor device and a semiconductor package.

BACKGROUND

Conventionally, a semiconductor package has been developed in which a redistribution layer is formed on a semiconductor chip, and bumps are bonded to the redistribution layer. By forming the redistribution layer, the bumps can be disposed at any position, and the external connectability is improved. High reliability is desirable for such a semiconductor package as well.

BRIEF DESCRIPTION OF THE DRAWINGS

FIGS. 8A to 8F are cross-sectional views showing a method for manufacturing the semiconductor package according to the embodiment; and FIGS. 9A to 9F are cross-sectional views showing a method for manufacturing a semiconductor package according to a comparative example.

DETAILED DESCRIPTION

A semiconductor device according to an embodiment includes: a first semiconductor chip having a first pad and a second pad, a depression being formed in the second pad; an organic insulating film provided on the first semiconductor chip, the organic insulating film covering the depression and not covering at least a portion of the first pad; and a redistribution layer having a lower portion connected to the first pad and an upper portion disposed on the organic insulating film.

The Embodiment of the invention will now be described.

Figure 1:
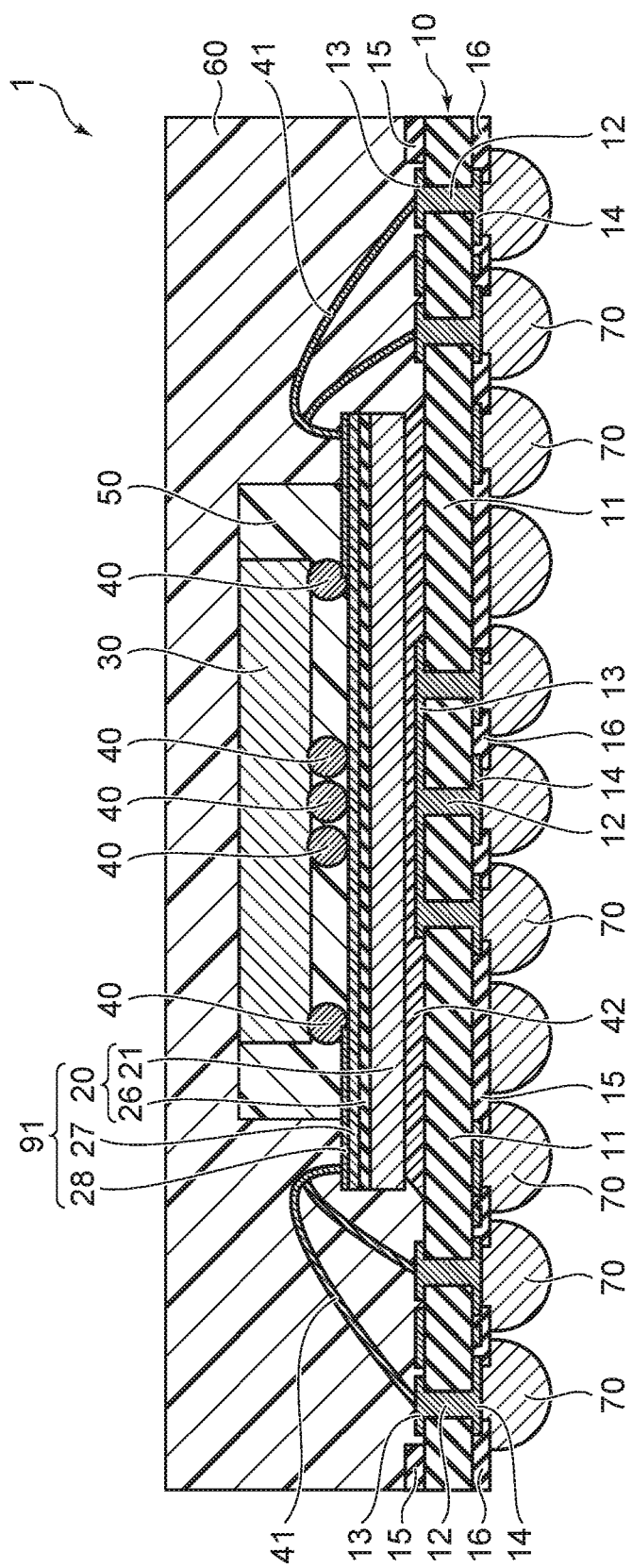
FIG. 1 is a cross-sectional view showing a semiconductor package according to an embodiment of the invention.

FIG. 1 is a cross-sectional view showing a semiconductor package according to the embodiment.

Figure 2:
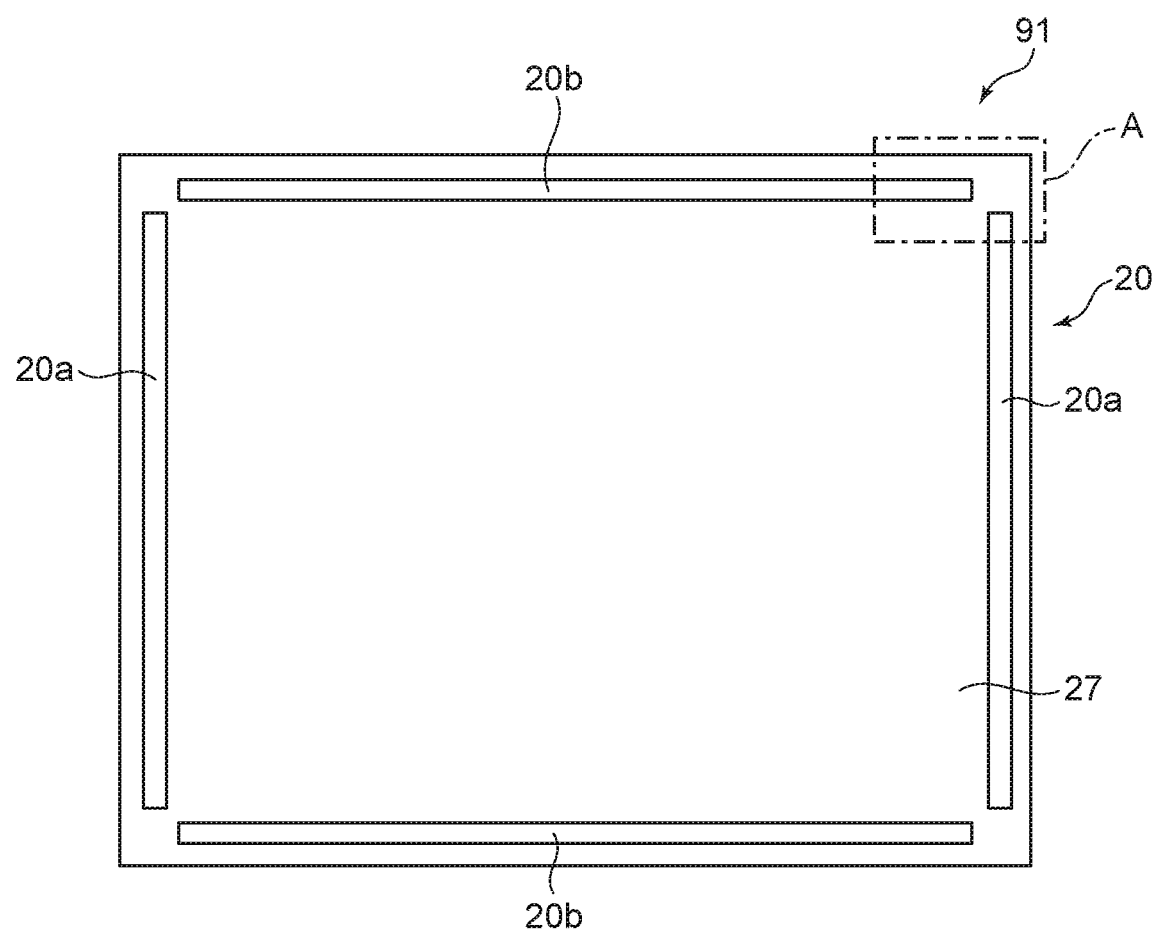
FIG. 2 is a plan view showing the semiconductor device of the semiconductor package according to the embodiment.

FIG. 2 is a plan view showing the semiconductor device of the semiconductor package according to the embodiment.

Figure 3:
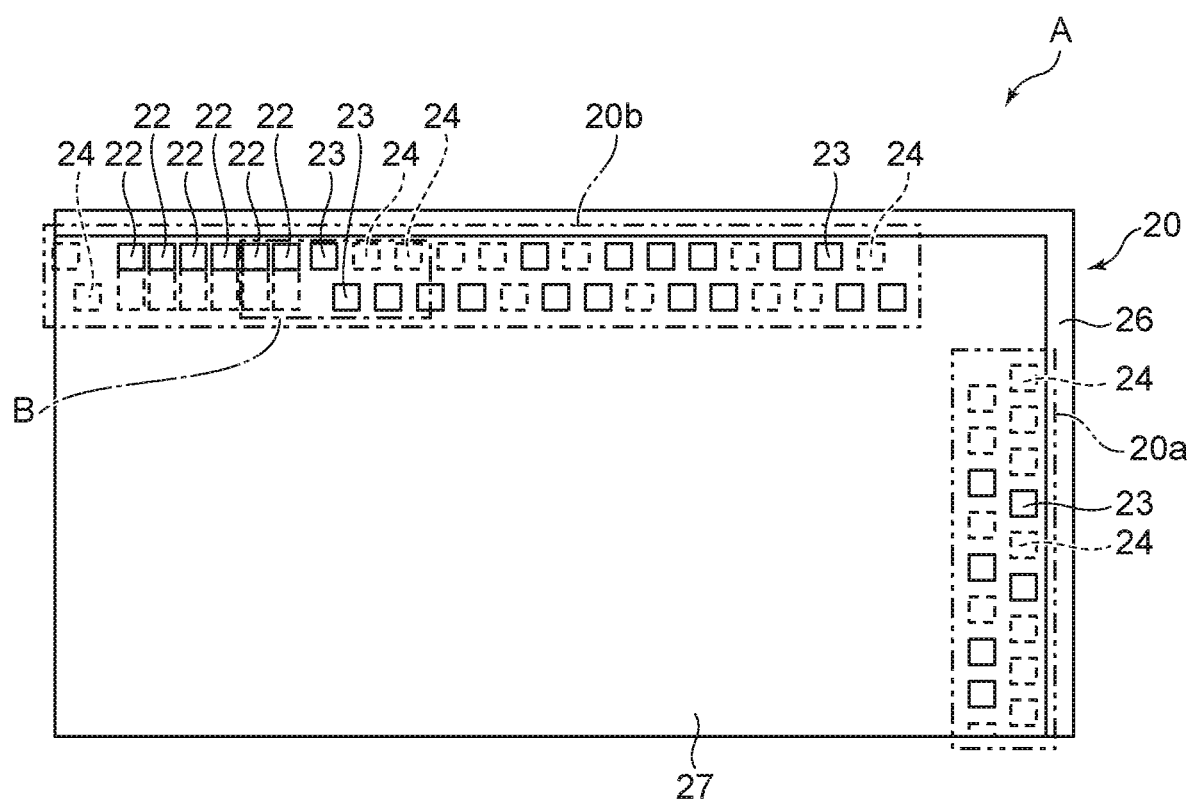
FIG. 3 is a partially enlarged plan view showing region A of FIG. 2.

FIG. 3 is a partially enlarged plan view showing region A of FIG. 2.

Figure 4:
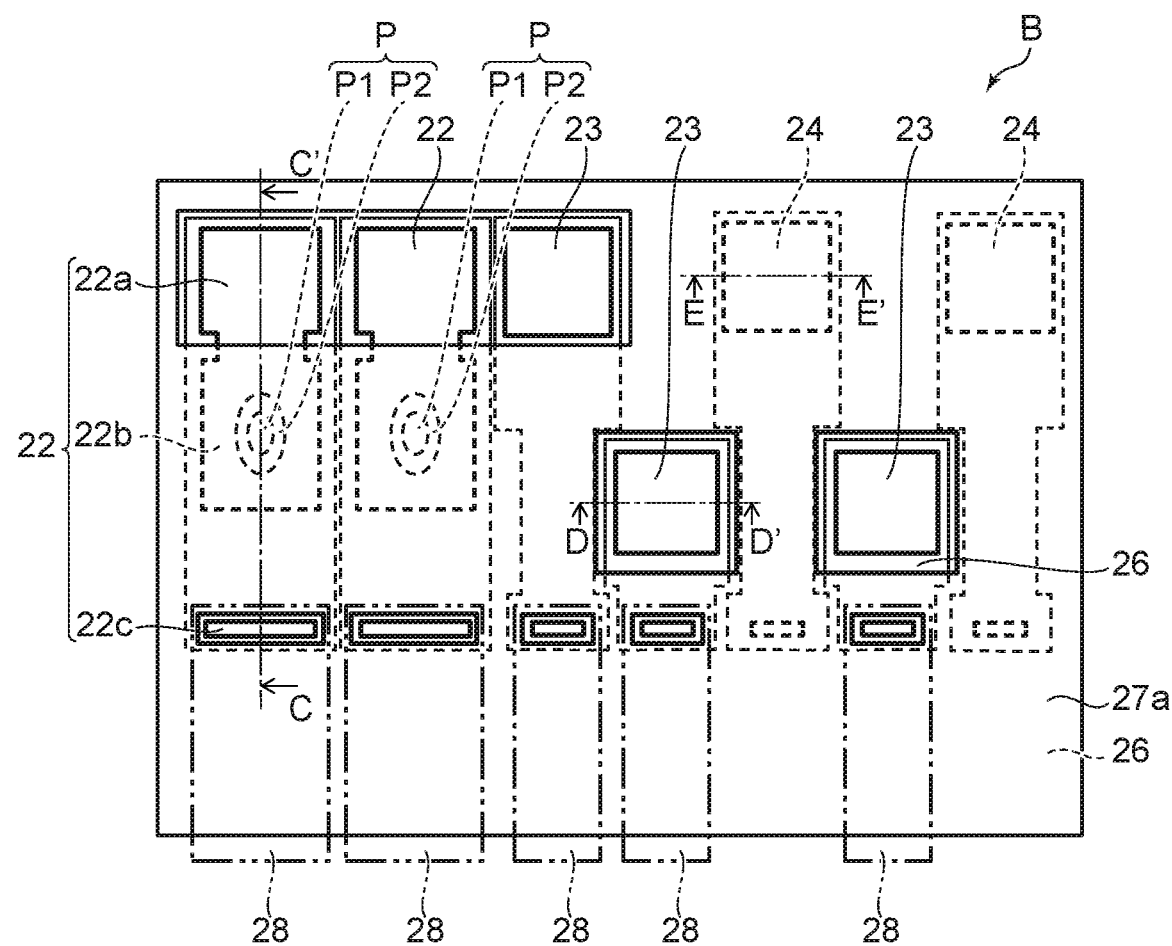
FIG. 4 is a partially enlarged plan view showing region B of FIG. 3.

FIG. 4 is a partially enlarged plan view showing region B of FIG. 3.

Figure 5:
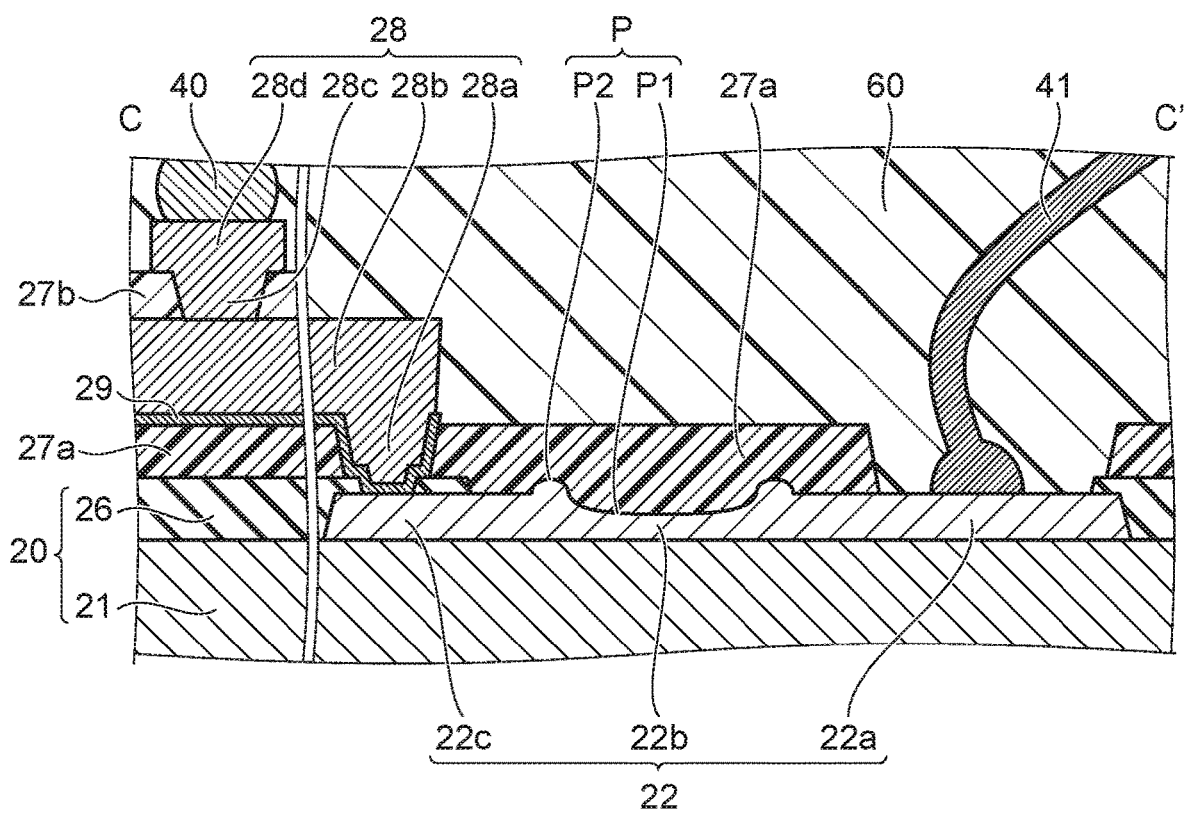
FIG. 5 is a cross-sectional view along line C-C' shown in FIG. 4.

FIG. 5 is a cross-sectional view along line C-C' shown in FIG. 4.

Figure 6:
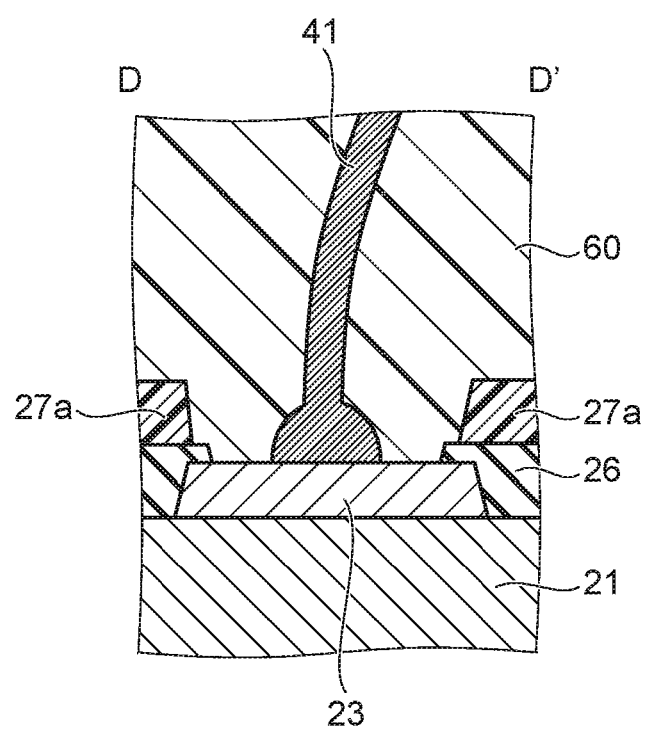
FIG. 6 is a cross-sectional view along line D-D' shown in FIG. 4.

FIG. 6 is a cross-sectional view along line D-D' shown in FIG. 4.

Figure 7:
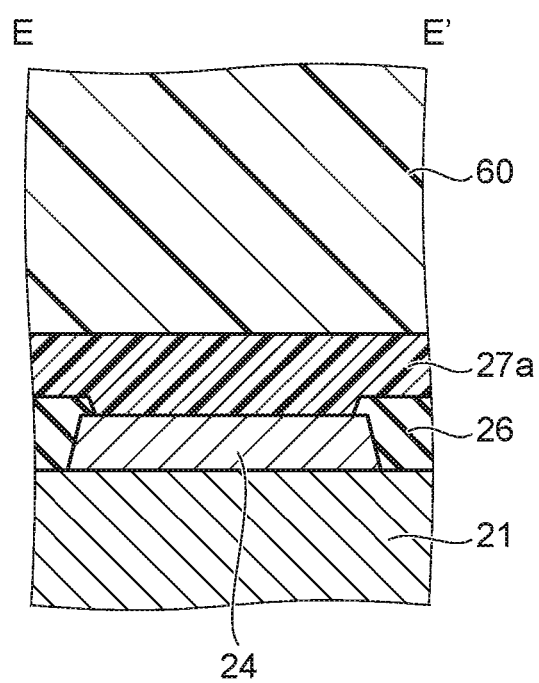
FIG. 7 is a cross-sectional view along line E-E' shown in FIG. 4.

FIG. 7 is a cross-sectional view along line E-E' shown in FIG. 4.

The drawings are schematic, and are exaggerated and simplified as appropriate. Components are not illustrated as appropriate for convenience of illustration. For example, the redistribution layer is not illustrated in FIG. 2 and FIG. 3.

As shown in FIG. 1, a mounting substrate 10, a semiconductor chip 20, a semiconductor chip 30, multiple bumps 40, an under-fill member 50, a resin member 60, and multiple bumps 70 are provided in a semiconductor package 1 according to the embodiment.

The semiconductor chip 20 is mounted to the mounting substrate 10. The semiconductor chip 30 is provided on the semiconductor chip 20. The multiple bumps 40 are disposed between the semiconductor chip 20 and the semiconductor chip 30. The under-fill member 50 is provided between the semiconductor chip 20 and the semiconductor chip 30 and covers the bumps 40. The under-fill member 50 also is disposed at the periphery of the semiconductor chip 30. The under-fill member 50 may be provided only in the region between the semiconductor chip 20 and the semiconductor chip 30. The resin member 60 is provided on the mounting substrate 10 and covers the semiconductor chip 20, the semiconductor chip 30, the bumps 40, and the under-fill member 50. The multiple bumps 70 are provided at the lower surface of the mounting substrate 10.

For example, DRAM (Dynamic Random Access Memory) is formed in the semiconductor chip 20; for example, a logic circuit is formed in the semiconductor chip 30. Terminals of the semiconductor chip 30 are connected to terminals of the semiconductor chip 20 via the bumps 40. The resin member 60 is a sealing member made of a resin material.

An insulative base 11, through-vias 12, an upper surface wiring layer 13, a lower surface wiring layer 14, an insulating film 15, and an insulating film 16 are provided in the mounting substrate 10. The through-vias 12 pass through the base 11 in the thickness direction. The upper surface wiring layer 13 is provided on the upper surface of the base 11, and the lower surface wiring layer 14 is provided on the lower surface of the base 11. The upper surface wiring layer 13 is connected to the lower surface wiring layer 14 via the through-vias 12. The insulating film 15 is provided on the peripheral portion of the upper surface of the base 11. The insulating film 16 is provided on a region of the lower surface of the base 11 where the lower surface wiring layer 14 is not provided, and the insulating film 16 covers the end portion of the lower surface wiring layer 14.

The upper surface wiring layer 13 is connected to a portion of the terminals of the semiconductor chip 20 via wires 41. The lower surface wiring layer 14 is connected to the bumps 70. Also, a bonding member 42 is provided between the mounting substrate 10 and the semiconductor chip 20. For example, the bonding member 42 is made of a bonding agent.

A chip main body 21, pads 22 to 24 (referring to FIG. 3), and a passivation film 26 that is an inorganic insulating film are provided in the semiconductor chip 20. The pads 22 to 24 are provided at the upper surface of the chip main body 21. For example, the pads 22 to 24 are formed of aluminum (Al). The pads 22 to 24 also are generally referred to as simply the "pad".

The passivation film 26 is provided on the chip main body 21. For example, the passivation film 26 is formed of silicon nitride (SiN). However, the passivation film 26 may be formed of an inorganic material other than silicon nitride. Portions of the pads 22 to 24 are covered with the passivation film 26, and the remaining portions are exposed.

A redistribution layer 28 and a polyimide film 27 that is an organic insulating film are provided on the semiconductor chip 20. The polyimide film 27 is formed of polyimide. However, the organic insulating film may be formed of an organic material other than polyimide. For example, the redistribution layer 28 is formed of copper (Cu) and nickel (Ni). The redistribution layer 28 is connected to the bumps 40. The semiconductor device 91 according to the embodiment includes the semiconductor chip 20, the polyimide film 27, and the redistribution layer 28.

As shown in FIG. 2, a bump pad region 20a and a bonding pad region 20b are set at the upper surface of the semiconductor chip 20. For example, the bump pad region 20a is disposed along a pair of mutually-opposing edges of the semiconductor chip 20. For example, the bonding pad region 20b is disposed along another pair of mutually-opposing edges of the semiconductor chip 20. The polyimide film 27 does not cover a portion of the bump pad region 20a, a portion of the bonding pad region 20b, and the end portion of the semiconductor chip 20, but covers the portions other than these portions. Bump pads (not illustrated) are provided in the bump pad region 20a.

As shown in FIG. 3 and FIG. 4, multiple pads 22, multiple pads 23, and multiple pads 24 are provided in the bonding pad region 20b. As described below, the pads 22 are used as inspection pads, wire bonding pads, and redistribution connection pads. The pads 23 are used in the semiconductor package 1. The pads 24 are not used in the semiconductor package 1. Although many pads are provided in the semiconductor chip 20, according to the configuration of the semiconductor package in which the semiconductor chip 20 is embedded, only some pads are connected externally and used. Therefore, the pads 23 that are used and the pads 24 that are not used exist in the semiconductor chip 20.

As shown in FIG. 4 and FIG. 5, a bonding region 22a where the wire 41 is bonded, a probe region 22b where a probe (not illustrated) is pressed when inspecting the electrical characteristics, and a redistribution region 22c that is connected to the redistribution layer 28 are set in the pad 22. In the semiconductor chip 20 after the inspection, a probe mark P that is formed when the probe is pressed remains in the probe region 22b. For example, the probe mark P has a crater shape in which a ring-shaped ridge P2 is formed at the periphery of one depression P1. Although there are also cases where the ridge P2 is not formed in the probe mark P, at least the depression P1 is formed.

The passivation film 26 covers the end portion of the pad 22, the end portion of the pad 23, and the end portion of the pad 24. The passivation film 26 also is disposed between the pads 22 to 24.

A lower layer 27a and an upper layer 27b are provided in the polyimide film 27. The polyimide film 27 is disposed on the passivation film 26 and is disposed also on portions of the pads not covered with the passivation film 26. More specifically, none of the bump pad region 20a and the bonding pad region 20b of the semiconductor chip 20 is covered with the upper layer 27b of the polyimide film 27. A portion of the bump pad region 20a and a portion of the bonding pad region 20b are covered with the lower layer 27a of the polyimide film 27. The lower layer 27a of the polyimide film 27 does not cover the bonding region 22a of the pad 22. The wire 41 is bonded to the upper surface of the bonding region 22a. The lower layer 27a of the polyimide film 27 also covers the probe region 22b and the redistribution region 22c of the pad 22. Accordingly, the lower layer 27a of the polyimide film 27 covers the probe mark P formed in the probe region 22b.

A contact portion 28a, an interconnect portion 28b, a via portion 28c, and a pad portion 28d are provided in the redistribution layer 28. The contact portion 28a passes through the lower layer 27a of the polyimide film 27 and is connected to the redistribution region 22c of the pad 22. The interconnect portion 28b is provided on the lower layer 27a of the polyimide film 27 and connected to the contact portion 28a. The interconnect portion 28b is drawn out to a region separated from the region directly above the contact portion 28a. The upper layer 27b of the polyimide film 27 covers the interconnect portion 28b.

The via portion 28c is provided on the interconnect portion 28b, is connected to the interconnect portion 28b, and passes through the upper layer 27b of the polyimide film 27. The pad portion 28d is provided on the upper layer 27b of the polyimide film 27 and is connected to the via portion 28c. The via portion 28c and the pad portion 28d are provided in a region separated from the region directly above the pad 22. The bump 40 is bonded to the upper surface of the pad portion 28d.

A barrier metal layer 29 is provided between the redistribution layer 28 and the lower layer 27a of the polyimide film 27. The barrier metal layer 29 includes, for example, copper (Cu) and titanium (Ti). Thus, the redistribution region 22c of the pad 22 is connected to the bump 40 via the barrier metal layer 29 and the contact portion 28a, the interconnect portion 28b, the via portion 28c, and the pad portion 28d of the redistribution layer 28.

As shown in FIG. 4 and FIG. 6, the end portion of the pad 23 that is used is covered with the passivation film 26, and the portion of the pad 23 other than the end portion is not covered with the passivation film 26. The lower layer 27a of the polyimide film 27 also does not cover the pad 23. Therefore, the resin member 60 contacts the pad 23. The wire 41 is bonded to the pad 23.

As shown in FIG. 4 and FIG. 7, the end portion of the pad 24 that is not used is covered with the passivation film 26, and the portion of the pad 24 other than the end portion is not covered with the passivation film 26. On the other hand, the entire pad 24 is covered with the lower layer 27a of the polyimide film 27. Therefore, in the region directly above the pad 24, the resin member 60 contacts the lower layer 27a of the polyimide film 27 but does not contact the passivation film 26. Also, the wire 41 is not bonded to the pad 24. The pad 24 is not connected to the redistribution layer 28; accordingly, the pad 24 is not connected to the bump 40.

A portion of a method for manufacturing the semiconductor package according to the embodiment will now be described.

FIGS. 8A to 8F are cross-sectional views showing the method for manufacturing the semiconductor package according to the embodiment.

Only the periphery of the pad 22 is shown in FIGS. 8A to 8F.

The semiconductor chip 20 is prepared as shown in FIG. 8A. In the semiconductor chip 20, the pads 22 to 24 and the passivation film 26 are provided on the chip main body 21. For example, the pads 22 to 24 are formed of aluminum. The electrical characteristics of the semiconductor chip 20 already have been inspected, and the probe mark P is formed in the probe region 22b of the pad 22. For example, the probe mark P has a crater shape in which the ring-shaped ridge P2 is formed at the periphery of the depression P1.

The passivation film 26 covers the region between the pads, the peripheral portion of the pad 22, the peripheral portion of the pad 23, and the peripheral portion of the pad 24 at the upper surface of the chip main body 21. On the other hand, the passivation film 26 does not cover the portion of the pad 22 other than the peripheral portion, the portion of the pad 23 other than the peripheral portion, and the portion of the pad 24 other than the peripheral portion.

Then, the lower layer 27a of the polyimide film 27 is formed as shown in FIG. 8B. The lower layer 27a is formed on the passivation film 26. The lower layer 27a is formed also on the probe region 22b of the pad 22. Thereby, the probe mark P is covered with the lower layer 27a.

Continuing as shown in FIG. 8C, the barrier metal layer 29 is formed on the entire surface by depositing copper or titanium.

Then, a resist pattern 101 is formed as shown in FIG. 8D. An opening 101a is formed in the resist pattern 101 in the region directly above the redistribution region 22c of the pad 22.

Continuing as shown in FIG. 8E, the contact portion 28a and the interconnect portion 28b of the redistribution layer 28 are formed in the opening 101a of the resist pattern 101 by depositing copper and nickel by using the resist pattern 101 as a mask. The contact portion 28a is formed in the lower layer 27a of the polyimide film 27, and the interconnect portion 28b is formed on the lower layer 27a. The contact portion 28a is connected to the redistribution region 22c of the pad 22 via the barrier metal layer 29.

Then, as shown in FIG. 8F, the resist pattern 101 is dissolved and removed by, for example, causing the resist pattern 101 to contact a chemical liquid. Originally, the pads 22 to 24 which are made of aluminum are fragile with respect to the chemical liquid. However, the bonding region 22a of the pad 22 is not damaged by the chemical liquid because the bonding region 22a is covered with the barrier metal layer 29. Also, as expected, the probe region 22b of the pad 22 is not damaged by the chemical liquid because the probe region 22b is covered with the lower layer 27a of the polyimide film 27. The redistribution region 22c of the pad 22 also is not damaged by the chemical liquid because the redistribution region 22c is covered with the lower layer 27a of the polyimide film 27 and the contact portion 28a and the interconnect portion 28b of the redistribution layer 28.

Continuing as shown in FIG. 4 to FIG. 7, the portion of the barrier metal layer 29 not covered with the redistribution layer 28 is removed by etching. Then, the upper layer 27b of the polyimide film 27 is formed. Then, the via portion 28c and the pad portion 28d of the redistribution layer 28 are formed. The via portion 28c is formed in the upper layer 27b of the polyimide film 27, and the pad portion 28d is formed on the upper layer 27b.

Then, as shown in FIG. 1 and FIG. 4 to FIG. 7, the bump 40 is bonded to the pad portion 28d of the redistribution layer 28. The bump 40 also is bonded to the bump pad region 20a of the semiconductor chip 20. Thereby, the bumps 40 are connected to each other via the pads and the redistribution layer 28. Then, the semiconductor chip 30 is bonded to the bumps 40. Thereby, the semiconductor chip 30 is connected to the semiconductor chip 20. Then, the under-fill member 50 is filled between the semiconductor chip 20 and the semiconductor chip 30 and at the periphery of the semiconductor chip 30. The under-fill member 50 may be filled only between the semiconductor chip 20 and the semiconductor chip 30. Then, the semiconductor chip 20 is mounted to the mounting substrate 10 by the bonding member 42. Then, the wires 41 are bonded to the pad 23 and to the bonding region 22a of the pad 22 at one end of each wire 41. The other ends of the wires 41 are bonded to the upper surface wiring layer 13 of the mounting substrate 10. Thereby, the terminals of the semiconductor chip 20 are connected to the terminals of the mounting substrate 10.

Continuing, the semiconductor chip 20, the semiconductor chip 30, the under-fill member 50, the wires 41, the bumps 40, etc., are covered by disposing a liquid resin material on the mounting substrate 10. Then, the resin material is solidified. The resin member 60 is formed thereby. At this time, the greater part of the passivation film 26 does not contact the resin member 60 because the greater part of the passivation film 26 is covered with the polyimide film 27. Thus, the semiconductor package 1 is manufactured.

Effects of the embodiment will now be described.

In the embodiment, the probe mark P that is formed in the probe region 22b of the pad 22 is covered with the lower layer 27a of the polyimide film 27 in the process shown in FIG. 8B. Thereby, when the chemical liquid is used to remove the resist pattern 101 in the process shown in FIG. 8F, the chemical liquid is blocked by the lower layer 27a and does not contact the probe region 22b. As a result, the damage of the pad 22 by the chemical liquid can be avoided. Therefore, the reliability of the semiconductor device 91 according to the embodiment is high.

In the embodiment, the portion of the passivation film 26 disposed in the region directly above the pad 24 is covered with the polyimide film 27 as shown in FIG. 7. The portion of the passivation film 26 disposed between the pads also is covered with the polyimide film 27. Therefore, the resin member 60 does not contact the passivation film 26 in these regions. The contact area between the resin member 60 and the passivation film 26 can be reduced thereby.

The adhesion is poor between the resin member 60 made of the resin material and the passivation film 26 made of the inorganic material. Therefore, when the contact area between the resin member 60 and the passivation film 26 is large and thermal stress is generated in the semiconductor package 1, the resin member 60 separates easily from the passivation film 26. When the resin member 60 separates from the passivation film 26, there is a possibility that an open defect may occur due to the wires 41 being lifted by the resin member 60 and being detached from the bonding region 22a of the pad 22 and the pad 23.

In the embodiment, the contact area between the resin member 60 and the passivation film 26 is small because the resin member 60 contacts the polyimide film 27 in the region directly above the pad 24 and the region directly above the region between the pads. The adhesion is good between the resin member 60 and the polyimide film 27 which is an organic insulating film. Therefore, the separation of the resin member 60 from the passivation film 26 can be suppressed, and the occurrence of open defects can be suppressed.

A comparative example will now be described.

FIGS. 9A to 9F are cross-sectional views showing a method for manufacturing the semiconductor package according to the comparative example.

The semiconductor chip 20 is prepared as shown in FIG. 9A. The configuration of the semiconductor chip 20 is similar to that of the embodiment described above, and the probe mark P is formed in the probe region 22b of the pad 22.

Then, the lower layer 27a of the polyimide film 27 is formed as shown in FIG. 9B. In the comparative example, the lower layer 27a is not formed on the probe region 22b of the pad 22. Also, the lower layer 27a is not formed on the pad 24 that is not used.

Continuing as shown in FIG. 9C, the barrier metal layer 29 is formed on the entire surface. Although the barrier metal layer 29 is formed on the probe mark P as well, there are cases where an uncovered portion 29a that is insufficiently covered with the barrier metal layer 29 is formed due to the unevenness of the probe mark P.

Then, the resist pattern 101 is formed as shown in FIG. 9D. The opening 101a is formed in the resist pattern 101. The resist pattern 101 also contacts the uncovered portion 29a of the barrier metal layer 29.

Continuing as shown in FIG. 9E, the contact portion 28a and the interconnect portion 28b of the redistribution layer 28 are formed in the opening 101a of the resist pattern 101.

Then, as shown in FIG. 9F, the resist pattern 101 is dissolved and removed by causing contact with a chemical liquid. At this time, the chemical liquid contacts the pad 22 via the uncovered portion 29a of the barrier metal layer 29. Thereby, the pad 22 is dissolved and damaged, and damage 22d occurs.

Subsequently, the resin member 60 is formed by a process similar to that of the embodiment described above. At this time, the resin member 60 contacts the passivation film 26 in the region directly above the pad 24 and the region between the pads. Therefore, the contact area between the resin member 60 and the passivation film 26 becomes large. Thereby, the resin member 60 separates from the passivation film 26 easily when thermal stress occurs in the semiconductor package after manufacturing. As a result, the wires 41 that are covered with the resin member 60 also are displaced upward and detach easily from the bonding region 22a of the pad 22 and the pad 23. An open defect occurs when the wire 41 detaches from the pad 22 or 23.

Conversely, according to the embodiment described above, the polyimide film 27 which is an organic insulating film covers the probe mark P and the pad 24; therefore, the damage of the pad 22 due to the chemical liquid for removing the resist pattern 101 can be avoided, and open defects of the wire 41 also can be suppressed. As a result, a semiconductor package that has high reliability can be manufactured.

According to the embodiments described above, a semiconductor device and a semiconductor package that have high reliability can be realized.

While certain embodiment has been described, this embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A semiconductor package, comprising:
a semiconductor device,
the semiconductor device including
a first semiconductor chip including a first pad and a second pad, a depression being formed in the second pad,
an organic insulating film provided on the first semiconductor chip, the organic insulating film covering the depression and not covering at least a portion of the first pad, and
a redistribution layer including a lower portion connected to the first pad, and an upper portion disposed on the organic insulating film, wherein
the first semiconductor chip further includes a third pad next to the first pad, and an inorganic insulating film disposed between the first pad and the third pad, and
the organic insulating film is provided on the inorganic insulating film;
a bump bonded to the redistribution layer;
a resin member covering the first semiconductor chip, the organic insulating film, the upper portion of the redistribution layer, and a part of the bump; and
a second semiconductor chip connected to the bump, the resin member also covering the second semiconductor chip.

2. The package according to claim 1, wherein
DRAM is formed in the first semiconductor chip, and
a logic circuit is formed in the second semiconductor chip.

3. The package according to claim 1, wherein
the first semiconductor chip further includes a fourth pad, and
the organic insulating film covers the fourth pad.

4. The package according to claim 3, wherein the fourth pad is not connected to the redistribution layer.

5. A semiconductor package, comprising:
a first semiconductor chip including a first pad, a second pad, and an inorganic insulating film covering the second pad and not covering at least a portion of the first pad;
an organic insulating film covering a portion of the inorganic insulating film covering the second pad, the organic insulating film not covering at least a portion of the first pad;
a redistribution layer including a lower portion connected to the first pad, and an upper portion disposed on the organic insulating film;
a bump bonded to the redistribution layer;
a second semiconductor chip connected to the bump; and
a resin member covering the first semiconductor chip, a second semiconductor chip, the organic insulating film, the upper portion of the redistribution layer, and a part of the bump.

6. The package according to claim 5, wherein the second pad is not connected to the bump.

7. The package according to claim 5, wherein
DRAM is formed in the first semiconductor chip, and
a logic circuit is formed in the second semiconductor chip.

* * * * *